US008080822B2

(12) United States Patent
Namdas et al.

(10) Patent No.: US 8,080,822 B2
(45) Date of Patent: Dec. 20, 2011

(54) SOLUTION-PROCESSED INORGANIC FILMS FOR ORGANIC THIN FILM TRANSISTORS

(75) Inventors: Ebinazar Benjamin Namdas, Singapore (SG); Tommy Cahyadi, Singapore (SG); G. Subodh Mhaisalkar, Singapore (SG); Pooi See Lee, Singapore (SG); Zhikuan Chen, Singapore (SG); Yeng Ming Lam, Singapore (SG); Lixin Song, Singapore (SG)

(73) Assignees: Nanyang Technological University, Singapore (SG); Agency for Science, Technology and Research, Singapore (SG)

( * ) Notice: Subject to any disclaimer, the term of this patent is extended or adjusted under 35 U.S.C. 154(b) by 415 days.

(21) Appl. No.: 12/302,155

(22) PCT Filed: May 22, 2007

(86) PCT No.: PCT/SG2007/000142
§ 371 (c)(1),
(2), (4) Date: Nov. 24, 2008

(87) PCT Pub. No.: WO2007/136351
PCT Pub. Date: Nov. 29, 2007

(65) Prior Publication Data
US 2009/0267058 A1 Oct. 29, 2009

Related U.S. Application Data

(60) Provisional application No. 60/802,122, filed on May 22, 2006.

(51) Int. Cl.
*H01L 29/72* (2006.01)

(52) U.S. Cl. ............ 257/40; 257/57; 257/411; 977/788; 977/936; 525/342

(58) Field of Classification Search .................... 257/40, 257/57, 411; 977/788, 936; 525/342
See application file for complete search history.

(56) References Cited

U.S. PATENT DOCUMENTS

| 2005/0022697 A1 | 2/2005 | Benrashid et al. |
| 2005/0234167 A1 | 10/2005 | Bae et al. |
| 2010/0140623 A1* | 6/2010 | Min et al. .................... 257/59 |

FOREIGN PATENT DOCUMENTS

| EP | 1 513 165 A1 | 3/2005 |
| KR | 2003-0023388 A | 3/2003 |
| WO | WO 02/16971 A2 | 2/2002 |
| WO | WO 03/054981 A1 | 7/2003 |

* cited by examiner

*Primary Examiner* — Edward Wojciechowicz
(74) *Attorney, Agent, or Firm* — Dickstein Shapiro LLP

(57) ABSTRACT

A method for fabricating a sol-gel film composition for use in a thin film transistor is disclosed. The method includes fabricating the sol-gel dielectric composition by solution processing at a temperature in the range 60° C. to 225° C. The sol-gel film made by the method, and an organic thin-film transistor incorporating the sol-gel film are also disclosed.

13 Claims, 9 Drawing Sheets

SOLUTION-PROCESSED INORGANIC FILMS FOR ORGANIC THIN FILM TRANSISTORS

REFERENCE TO RELATED APPLICATION

Reference is made to our earlier U.S. provisional patent application No. 60/802,122 filed May 22, 2006 for an invention titled "Solution Processed Inorganic films As Gate Dielectric for Organic Thin Film Transistors" the priority of which is hereby claimed, and the contents of which are hereby incorporated by reference as if disclosed herein in their entirety.

TECHNICAL FIELD

This invention relates to electronic devices with solution-processed inorganic films and methods of fabricating such devices and particularly, though not exclusively, relates to thin-film transistors ("TFT"s) with solution-processed films of an inorganic material and/or mixtures of inorganic materials, and methods of fabricating such thin-film transistors. In particular, but not exclusively so, the invention relates to organic thin-film transistors ("OTFT"s) with at least one dielectric layer and/or surface modifier layer fabricated with a low temperature solution to improve carrier mobility in the transistor structure.

BACKGROUND

Research into OTFTs has gained great interest because of their potential applications in low cost and large area flexible electronics. These include driving circuits for future all-organic OLED-based flat panel displays, plastic RF-ID circuits, gas sensors, and chemical sensors.

The most common gate dielectric in organic OTFTs is a thermally-grown silicon oxide ($SiO_2$) on crystalline silicon. However, for low-cost, all-plastic, and large-area applications the use of thermally grown $SiO_2$ is not of particular interest. A solution-processable gate dielectric is the most attractive alternative as it can be easily prepared by spin coating, casting, or printing at low temperature and under ambient conditions.

Various solution-processable gate dielectrics have been used in the past. These include poly-4-vinylphenol (PVP), polymethyl methacrylate (PMMA), poly vinyl alcohol ("PVA"), benzocyclobutene ("BCB"), polyimide ("PI"), and self-assembled monolayers. OTFTs using a polymer dielectric operate at high voltages due to low dielectric constant (k) values. Therefore, inorganic oxides such as $TiO_2$, $Ta_2O_5$, and $Al_2O_3$ are used as they have higher k values and thus the operating voltages can be reduced. However, inorganic oxides require fabrication techniques such as anodic oxidation, magnetron sputtering, and electron-beam evaporation. This makes the deposition process and consequential device fabrication relatively difficult and expensive. It is therefore desirable to have solution-processable inorganic dielectrics for low operating voltage OTFTs.

SUMMARY

According to an exemplary aspect there is provided a method for fabricating a sol-gel film composition for use in a thin film transistor, the method comprising fabricating the sol-gel dielectric composition by solution processing at a temperature in the range 60° C. to 225° C.

The sol-gel film composition may be made from a precursor. The precursor may comprise at least one of: organosilicates, organosilanes, silane coupling agents, silicates derivatives, tetraalkylorthosilicate, and silane derivatives. Alternatively, the precursor may comprise at least one member selected from the group consisting of: organosilicates, organosilanes, silane coupling agents, silicates derivatives, tetraalkylorthosilicate, silanes derivatives, metal alkoxides, metal alkoxyalkoxide; and at least one polymer consisting of at least one of: poly(methyl methacrylate), poly(vinyl alcohol), polyethylene oxide-based block copolymers, and polystyrene-poly(4-vinyl pyridine) diblock copolymer.

The sol-gel film may be fabricated from at least one of: undoped spin-on-glass, and doped spin-on-glass. The sol-gel film may be a mixture of one or more of: an organic polymer, an organic monomers, and organically modified sol-gels. The sol-gel film may be doped by at least one of: a metal oxide, and a block copolymer composite with core comprising inorganic materials, metal, or metal-oxide. The block copolymer may comprise polystyrene-poly(4-vinyl pyridine), and may contain metallorganic precursors. The metal precursors may comprise titanium isopropoxide. The metal oxide may be at least one of: metal alkoxyalkoxide, and metal alkoxide.

The sol-gel may further comprise a mixture of hydrophobic molecules. The hydrophobic molecules may comprise at least one of: octadecyltrichlorosilane, hexamethyldisilazane, and derivatives thereof.

The sol-gel film composition may have a dielectric constant in the range 2 to 50, and may be formed on a substrate. The substrate may be selected from: glass, plastic, quartz, metal foil, undoped silicon and heavily doped silicon.

According to another exemplary aspect there is provided a sol-gel film composition when prepared by the above.

According to a further exemplary aspect there is provided a sol-gel film for use in organic thin film transistors as a dielectric film, the sol-gel film comprising at least one of: a polymer, and a co-polymer; the at least one of the polymer and co-polymer containing clusters of nano-particles of at least one selected from the group consisting of: inorganic materials, metal, and metal-oxide.

The sol-gel film may comprise at least one member selected from of: organosilicates, organosilanes, silane coupling agents, silicates derivatives, silanes derivatives, metal alkoxides, metal alkoxyalkoxide, tetraalkylorthosilicate; and a polymer consisting of at least one member of the group consisting of: poly(methyl methacrylate), poly(vinyl alcohol), polyethylene oxide-based block copolymers, and polystyrene-poly(4-vinyl pyridine) diblock copolymer.

The sol-gel film may comprise at least one of: undoped spin-on-glass, and doped spin-on-glass. The sol-gel film may be a mixture of one or more of: an organic polymer, an organic monomers, and organically modified sol-gels. The sol-gel film may be doped by at least one of: a metal oxide, and a block copolymer composite with core comprising inorganic materials, metal, or metal-oxide. The block copolymer may comprise polystyrene-poly(4-vinyl pyridine), and may contain metallorganic precursors. The metal precursors may comprise titanium isopropoxide. The metal oxide may be at least one of: metal alkoxyalkoxide, and metal alkoxide.

The sol-gel may further comprise a mixture of hydrophobic molecules. The hydrophobic molecules may comprise at least one of: octadecyltrichlorosilane, hexamethyldisilazane, and derivatives thereof. The sol-gel film composition may have a dielectric constant in the range 2 to 50.

According to a yet further aspect there is provided an organic thin film transistor comprising a sol-gel film as described above, the sol-gel film being formed as layer before the semiconductor layer and/or on substrate.

The substrate may be of: glass, plastic, quartz, metal foil, undoped silicon and/or heavily doped silicon. The organic thin film transistor may have at least one property selected from: a sub-threshold slope less than 2 volts per decade, and an on/off ratio of at least $10^3$.

The sol-gel film may be a surface modifier to enhance the transport properties in a semiconductor. The semiconductor may be at least one of: organic, inorganic, hybrids, or mixtures thereof. The semiconductor may be pentacene.

The organic thin film transistor may further comprise a layer of poly[5,5'-bis(3-dodecyl-2-thienyl)-2,2'-bithiophene] and/or a capping layer of organic, inorganic, hybrids, or mixtures thereof between the sol-gel layer and the semiconductor layer. The capping layer may be at least one of: poly-α-methylstyrene and octyltrichlorosilane The organic thin film transistor may comprise one of: a bottom gate with top contact, a bottom gate with bottom contact, top gate with top contact, a top gate with bottom contact, a top gate with top contact enhanced by surface modifier, and a top gate with bottom contact enhanced by surface modifier.

According to a final exemplary aspect there is provided an organic thin film transistor comprising a sol-gel film as described above wherein the sol-gel film further comprises a semiconductor comprising at least one of: a semiconductor material, a plurality of semiconductor materials, and a mixture of semiconductor materials. The semiconductor may be deposited on the sol-gel film. Alternatively, the semiconductor may not be deposited on the sol-gel film. The semiconductor may be at least one of: organic, inorganic, hybrids, or mixtures thereof.

BRIEF DESCRIPTION OF THE DRAWINGS

In order that the invention may be fully understood and readily put into practical effect there shall now be described by way of non-limitative example only exemplary embodiments of the present invention, the description being with reference to the accompanying illustrative drawings.

In the drawings.

DETAILED DESCRIPTION OF THE EXEMPLARY EMBODIMENTS

Figure 1:
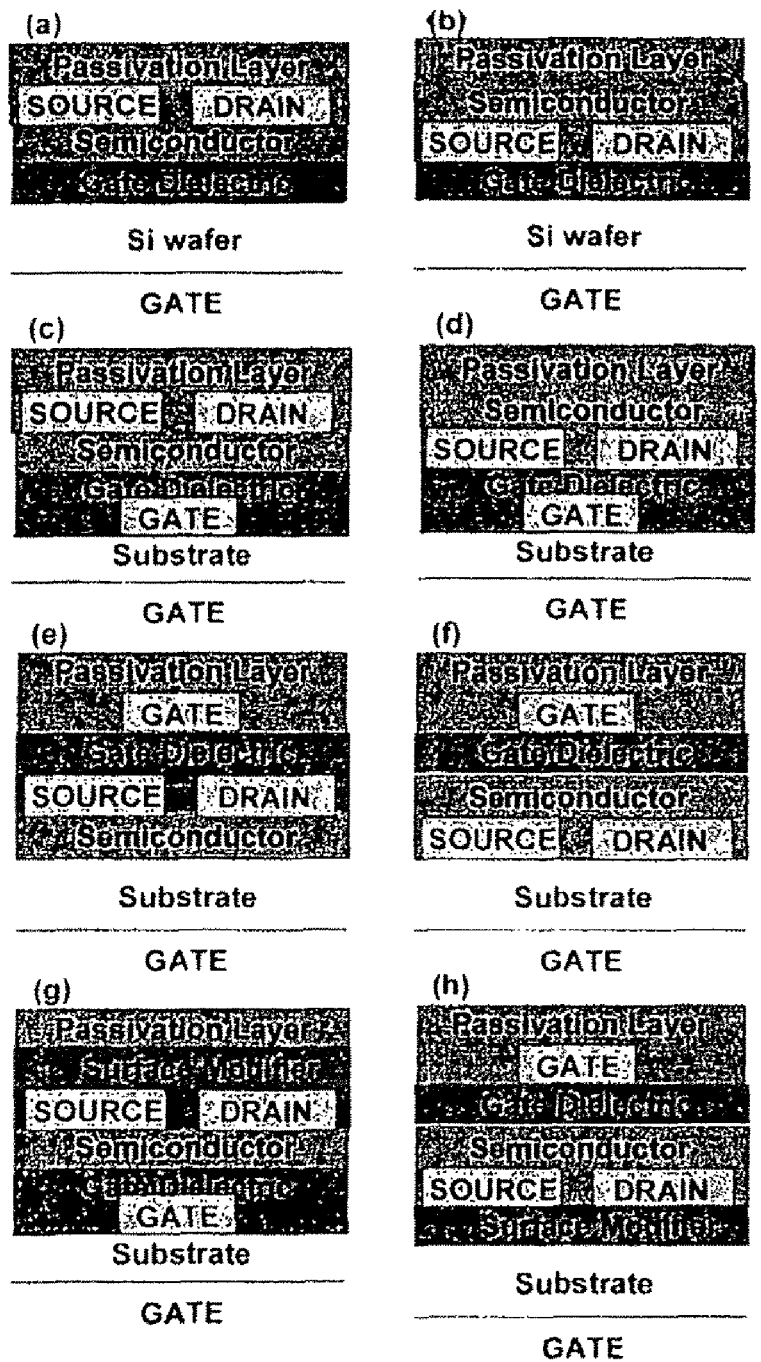
FIG. 1 is a schematic representation of exemplary device structures of TFFs with sol-gel used in dielectric stack and/or surface modifier stack (sol-gel TFTs)

In FIG. 1 there is shown a number of structures of sol-gel TFTs with sol-gel film in gate dielectrics stack and/or surface modifier stack:
(a) is a common bottom gate with top contact;
(b) is a common bottom gate with bottom contact;
(c) is a patterned bottom gate with top contact;
(d) is a patterned bottom gate with bottom contact;
(e) is a top gate with top contact;
(f) is a top gate with bottom contact;
(g) is a top gate with top contact enhanced by surface modifier;
(h) is a top gate with bottom contact enhanced by surface modifier.

Figure 2:
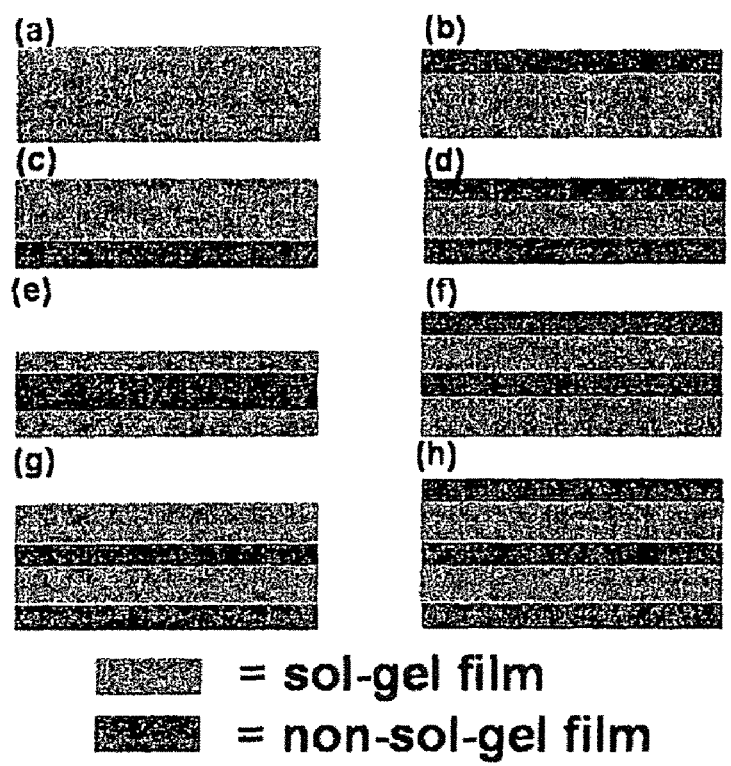
FIG. 2 is a schematic representation of exemplary sol-gel use in gate dielectric stack and/or surface modifier stack.

The dielectric stack and/or surface modifier stack are as described with reference to FIG. 2. The dielectric stack and/or surface modifier stack may comprise one or more of sol-gel film and/or non-sol-gel film. The non-sol-gel film may be organic, inorganic, hybrids, or mixtures thereof.

The sol-gel solution and/or film may be formed from precursors comprising a polymer and/or co-polymer and containing clusters of nano-particles of inorganic materials, metals or metal-oxide. The precursors may be one or more of: organosilicates, organosilanes, silane coupling agents, silicates derivatives, silanes derivatives, metal alkoxides, and alkoxyalkoxide The polymer may be one or more of: poly (methyl methacrylate), poly(vinyl alcohol), polyethylene oxide-based block copolymers, and polystyrene-poly(4-vinyl pyridine) ("PS-P4VP") diblock copolymer. The co-polymer may be polystyrene-poly(4-vinyl pyridine) containing metal-lorganic precursors such as, for example, titanium isopropoxide($Ti(OCH(CH_3)_2)_4$).

The sol-gel solution and/or film may be fabricated from undoped spin-on-glass and/or doped spin-on-glass. Doping may be by use of a metal oxide and/or block copolymer composite with a core of inorganic materials, metal, or metal-oxide. The core may be one or more of: metal alkoxyalkoxide, and metal alkoxide. The sol-gel solution and/or film may be a mixture of one or more of: an organic polymer, organic monomers, and organically modified sol-gels. The sol-gel solution and/or film may include a mixture of hydrophobic molecules such as, for example, octadecyltrichlorosilane, hexamethyl-disilazane, and derivatives thereof.

The sol-gel film may have a dielectric constant in the range from 2 to about 50 and may be used as surface modifier to enhance the transport properties in the semiconductor. The organic thin film transistor may have:
  a) a sub-threshold slope below about or less than 2 volts per decade; and/or
  b) an on/off ratio of at least about $10^3$; and/or
  c) a charge-carrier mobility at least about 100% greater than a comparison OTFT that lacks the sol-gel layer.

Sol-gel processing to fabricate dielectrics for OTFTs may be performed by combining a precursor such as, for example, tetraethylorthosilicate ("TEOS") at 99.9% purity, ethanol, deionizer water, and concentrated HCl then stirring at room temperature for 90 minutes in the following molar ratios: 1:10:3.5:0.003. Base catalyst such as, for example, 0.1 M $NH_4OH$ may be added. The solution may be aged at temperature ranges 0 to 100° C. and/or combinations thereof. The aging time may range from 10 minutes to 14 days. Films may be made from filtered solution by solution processing methods. One of the methods can be spin coating (ranges from 500 rpm to 6000 rpm). It may be deposited onto substrates. The substrate may be of a material such as, for example, glass, plastic, quartz, metal foil, undoped silicon and heavily doped silicon with and without other materials on the substrate. Such as, for example, sol-gel film is deposited onto a bare n-Si wafer substrate or Si wafers (as a gate electrode), with thermally grown $SiO_2$ (as a gate leakage blocking layer). The substrates are carefully cleaned and/or treated prior to spin coating. The sol-gel films may be dried at ambient condition and/or under different conditions. The different conditions may have $O_2$ molecules and/or other molecules as the environment gas. Solution processing is preferably at a relatively low temperature more preferably in the range about 60° C. to about 225° C.

A thermally grown 30 nm thick $SiO_2$ onto n-type Si-wafer can be used as a reference sample for OTFT fabrication. The sol-gel and control sample may be heated at 100° C. in vacuum to further treat the sol-gel.

The semiconductor may be organic, inorganic, hybrids, or mixtures thereof. The semiconductor materials may be mixed in the sol-gel solution and/or film.

To fabricate the OTFT pentacene was purified prior to use. A 50 nm thick pentacene film was deposited at 0.5 Å/s rate on both the sol-gel and the control sample in an evaporator at a base pressure of $10^{-7}$ mbar and maintaining the substrate temperature at 100° C. Gold source and drain electrodes were deposited on the surface of the pentacene film by shadow mask evaporation to obtain a top-contact structure as shown in FIG. 1a (but without the passivation layer). Gate width may vary from 500 to 4000 μm, while gate length may vary from 100 to 200 μm.

The OTFTs were characterized using a Keithley SCS-4200 characterization system under vacuum conditions (~$10^{-4}$ to $10^{-5}$ Torr) using a Desert Cryogenic probe station. The mobility values in the saturation regime ($V_D$>$V_G$) were extracted from:

$$I_D = C_i \times \mu (W/2L)(V_G - V_T)^2$$

where $I_D$ is the drain current, $C_i$ is the capacitance per unit area of the gate dielectric layer, $V_D$ is the drain voltage, $V_G$ is the gate voltage, $V_T$ is the threshold voltage, μ is the field-effect mobility, and W and L are the channel width and length dimensions, respectively. The $V_T$ of the device was determined from the relationship between the square root of the source-drain current $I_D$ at the saturated regime and the $V_G$ of the device by extrapolating the measured data to $I_D$=0.

Figure 3:
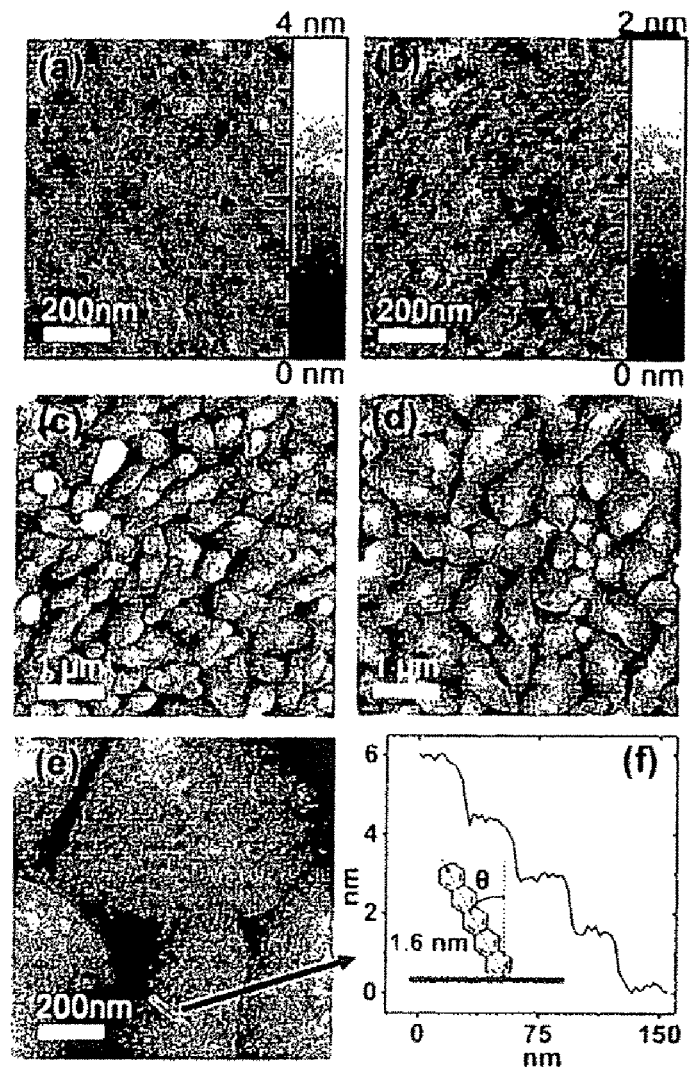
FIG. 3 is a series of AFM images of different films.

The sol-gel and pentacene films were analyzed by atomic force microscopy to investigate the film quality and surface roughness. FIG. 3 has images that illustrate the result of the analysis. FIG. 3a is a 45 nm thick thermally-grown $SiO_2$ on silicon substrate and FIG. 3b is a 399 nm thick spin coated sol-gel film on silicon substrate.

The sol-gel films were typically 399 nm thick, uniform, and displayed a smooth surface with root-mean-square roughness of ~1.9 Å whereas the thermally grown films displayed a much rougher surface of ~3.1 Å rms.

FIG. 2c shows a 50 nm thick pentacene film on thermally grown $SiO_2$ whereas FIG. 2d is a 50 nm thick pentacene film grown on a sol-gel film. The pentacene film grown on the sol-gel film shows different molecular arrangements than those of the pentacene film on the thermally grown $SiO_2$.

FIG. 3e is a high resolution AFM image of pentacene on sol-gel and FIG. 3f shows the surface profile of the pentacene on sol-gel of FIG. 3e and indicates a terrace height of about 1.5 nm and orientation of the pentacene molecule relative to the substrate. The pentacene thin films deposited on sol-gel dielectrics exhibited a grain size of ~1.0 μm and each grain has a terrace-structure, with a series of 12 to 14 terraces.

Contact angle measurement of the surface of the sol-gel and thermally grown $SiO_2$ samples yielded wetting angles of 50° and 40° respectively, thus indicating that the sol-gel surfaces are more hydrophobic than the thermally grown oxides. The contact angle of sol-gel may increase to around 80° when the sol-gel is subjected to heat treatment in an ultrahigh vacuum.

Figure 4:
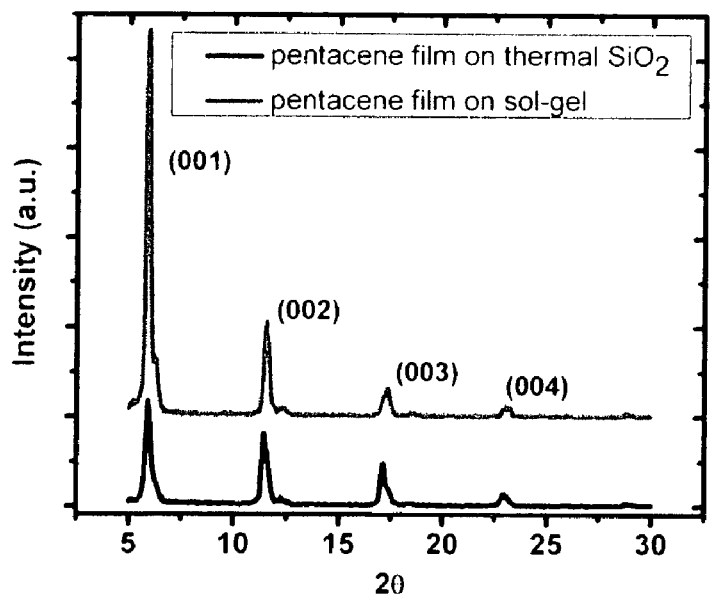
FIG. 4 is a graph of an X-ray diffraction scan.

FIG. 4 is a graph of an X-ray diffraction scan of 50 nm thick pentacene film deposited on:

(a) a thermally grown SiO2 (black line); and
(b) a sol-gel film (grey line).

All peaks correspond to (00l) planes, indicating that all crystals are oriented to their (00l) planes parallel to the substrates and come from the substrate-induced thin film phase. This is characterized by an inter-planar spacing of 15.5 Å in the pentacene film. The small contribution of the triclinic bulk phase exhibits a vertical periodicity of 14.5 Å.

Figure 5:
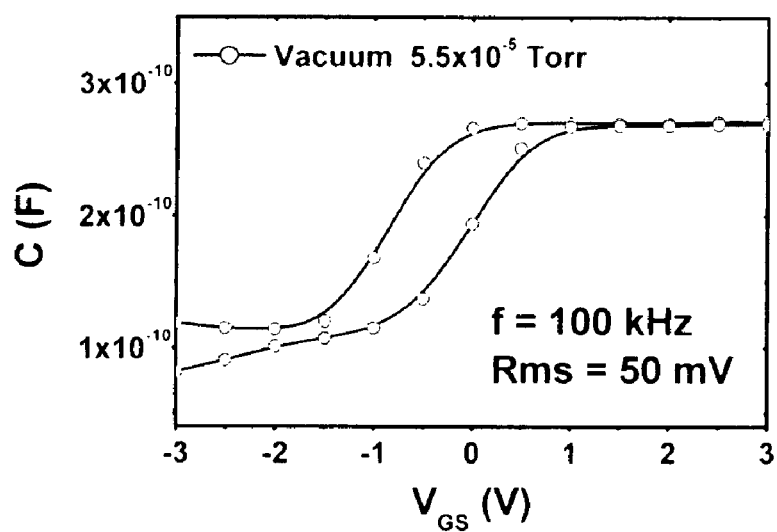
FIG. 5 is capacitance-voltage curve of a metal-insulator-semiconductor capacitor with sol-gel dielectric.

The dielectric properties of sol-gel films were investigated using a conventional metal-insulator-semiconductor ("MIS") structure. FIG. 5 shows high frequency capacitance-voltage curves measured at room temperature in vacuum ($10^{-5}$ mbar). The device exhibits typical MIS characteristics with accumulation and depletion regions. In the accumulation region, a capacitance of 24 nF was observed that corresponds to a dielectric constant, k=11, which is much higher than the dielectric constant for thermally grown $SiO_2$ (k=3.9). Higher observed dielectric constants of sol-gel films may be attributed to the presence of polar molecules trapped inside the sol-gel film and/or —OH bonds inherently present in the sol-gel film structures. Polar molecules such as water and organic reactants contribute to the increase in the dielectric constant. A clockwise hysteresis and capacitance-voltage curve shifts toward negative voltages indicate the presence of the trap states and mobile ions. The trapping sites are expected to be at the interface of sol-gel. The mobile ions such as $Cl^-$, $H^+$ and $OH^-$ originating from the sol-gel synthesis also contribute to the observed hysteresis.

Figure 6:
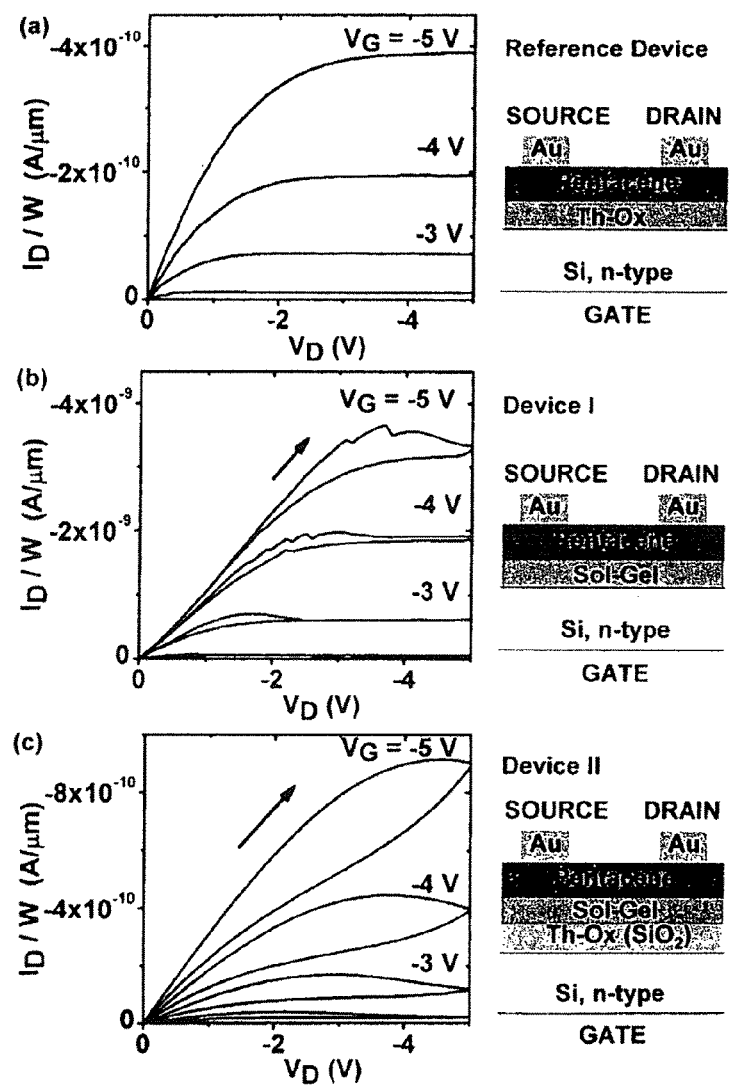
FIG. 6 is three graphs showing the output characteristic of a control sample and two exemplary embodiments.
Figure 7:
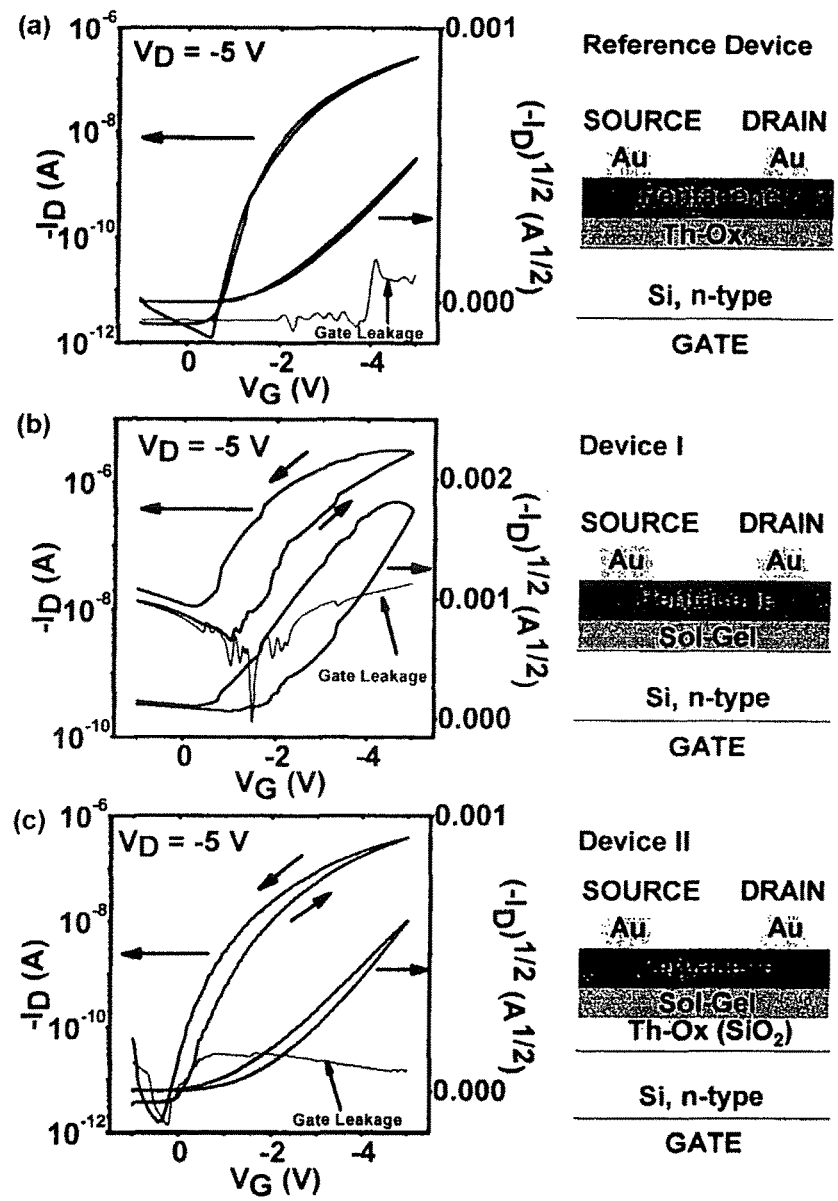
FIG. 7 is three graphs showing the transfer characteristics of a control sample and two exemplary embodiments.

As stated above the control sample is a thermally grown $SiO_2$ dielectric consisting of 30 nm thick thermally grown $SiO_2$ dielectric with W=500 μm and L=1150 μm. The electrical characteristics of the control sample are shown in FIGS. 6a and 7a. Transfer characteristics of the control sample were measured by sweeping the gate voltage ($V_g$) from 1 to −5 V (forward bias) and −5 to 1 V (reverse bias) at constant drain-source voltage (Vds) of −5V. The carrier mobility was calculated in the saturation region from the plot of the square root of the drain current (Id) versus $V_g$ in forward bias (FIG. 7a). From the electrical characteristics, parameters such as carrier field mobility, threshold voltage, sub-threshold swing and on/off ratio were determined. These are given in Table 1 below. The control sample exhibited a carrier mobility of 0.12 $cm^2 V^{-1} s^{-1}$, a threshold voltage of −1.61 V, a sub-threshold swing of 250 mV/decade, and an on/off ratio of $10^5$. These parameters are quite typical for the pentacene OTFT with thermally grown $SiO_2$ as the gate dielectric.

To evaluate the quality of sol-gel gate dielectric OTFT devices consisting of 399 nm spin coated sol-gel film, 50 nm thick thermally grown pentacene film, and thermally evaporated gold contact were fabricated (e.g. see FIG. 1a). The output and transfer characteristics of OTFT are presented in FIGS. 6b and 7b and included in Table 1 below. Carrier field mobility, threshold voltage, sub threshold swing and on/off ratio were determined as 2.08 $cm^2 v^{-1} s^{-1}$, −1.76 V, 750 mV/decade, $10^3$ respectively from forward bias Id-Vg curve. The sol-gel OTFTs showed hysteresis behavior both in the drain-source voltage sweep and the gate-source voltage sweep. Table 1 is a summary of the parameters extracted from the OTFTs fabricated using thermally grown $SiO_2$, sol-gel, thermally grown $SiO_2$+sol-gel dielectric.

Figure 9:
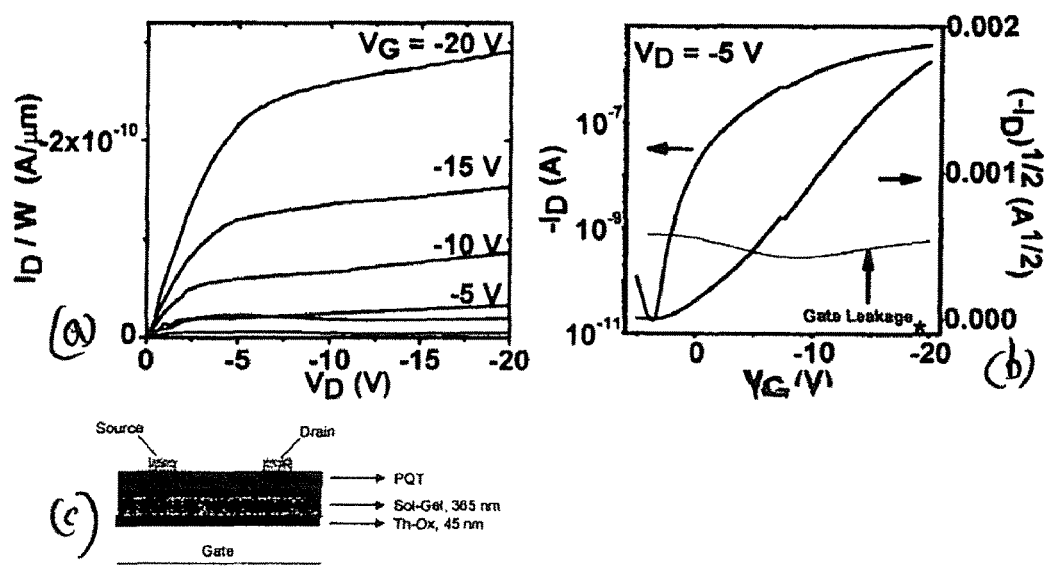
FIG. 9 is representations of a solution processed PQT with a sol-gel dielectric, and its performance contrasted with a control sample.

FIG. 9c shows OTFT devices that were fabricated using a 365 nm spin coated sol-gel film on a 45 nm thick thermally

TABLE 1

| Dielectric | $\mu_h$ (cm²/Vs) | $V_t$ (V) | s.s (mV/decade) | $I_{ON}/I_{OFF}$ | $I_{D,SAT}/W$ (A/μm) | $C_i$ (F/cm²) |
|---|---|---|---|---|---|---|
| $SiO_2$ (30 nm) | 0.12 | −1.61 | 250 | $1.4 \times 10^5$ | $-3.88 \times 10^{-10}$ | $1.5 \times 10^{-8}$ |
| Sol-gel (399 nm) | 2.08 | −1.76 | 750 | $1.00 \times 10^3$ | $-3.33 \times 10^{-9}$ | $2.44 \times 10^{-8}$ |
| $SiO_2$(18nm) + Sol-gel (391 nm) | 0.67 | −1.10 | 300 | $2.64 \times 10^5$ | $-9.04 \times 10^{-10}$ | $2.2 \times 10^{-8}$ |

Sol-gel OTFTs with thermally grown $SiO_2$ blocking layer were fabricated that consisted of 391 nm spin coated sol-gel films, on an 18 nm thick thermally grown $SiO_2$ layer that acts as a 'blocking' layer (e.g. FIG. 1g). The output and transfer characteristics are shown in FIGS. 6c and 7c as well as in Table 1 above. They show excellent transistor characteristics at −5V. The value of on/off ratio reaches to $2.64 \times 10^5$, carrier mobility of 0.67 cm² V⁻¹ s⁻¹, threshold voltage of −1.10 V, and a sub threshold swing of 300 mV/decade. The on/off ratio is improved by a factor of 100 compared to OTFT device without thermally grown $SiO_2$ blocking layer. The mobility value is also improved by factor of 5 compared to the control sample OTFT.

Figure 8:
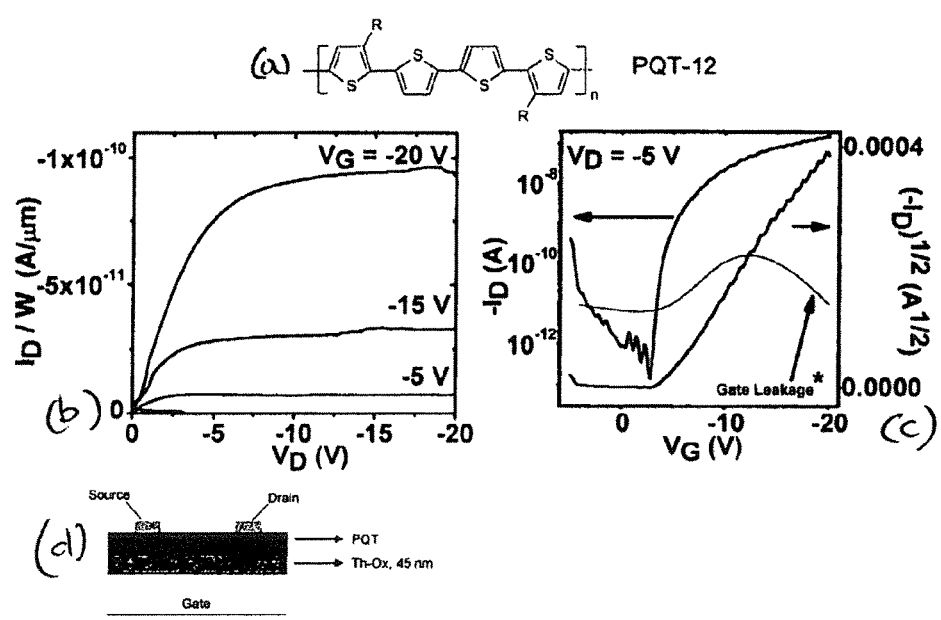
FIG. 8 is representations of a solution processed PQT, and its performance contrasted with a control sample.

Solution processed sol-gel OTFT fabrication may be by preparing a 0.3 wt % solution of poly[5,5'-bis(3-dodecyl-2-thienyl)-2,2'-bithiophene] ("PQT-12") (FIG. 8a) in dichlorobenzene at about 70° C. The resulting solution was subject to ultrasonic agitation while being cooled to room temperature. The solution was filtered using a 1 μm filter and then spin coated on a n-type Si substrate with 45 nm thermally grown $SiO_2$ (Th-Ox) to form a PQT-12 semiconductor layer that was 20 nm thick (FIG. 8d). The PQT-12 semiconductor layers were then dried in a vacuum and annealed at the PQT-12's liquid-crystalline phase transition temperatures of 120-140° C. Subsequently, the gold source and drain electrodes were vacuum deposited onto the PQT-12 semiconductor layer through a shadow mask, thus creating an array of OTFTs with various dimensions. Gate width varied from 500 to 4000 μm, while gate length varies from 100 to 200 μm.

The electrical characteristics of the control sample $SiO_2$ dielectric and spin coated PQT-12 are shown in FIGS. 8b and d as well as Table 2 below. The control sample $SiO_2$ dielectric exhibited a carrier mobility of 0.005 cm² V⁻¹ s⁻¹, and an on/off ratio of $6 \times 10^5$. For the spin coated PQT-12, $I_g$ (@$V_g$=−5V) was $1.02 \times 10^{-11}$ A and the integration time was normal. The gate leakage in $I_dV_g$ was taken from $I_dV_d$ measurements. For the top contact, W/L were 500/150; μ was 0.005 cm²/Vs; $V_t$ was 3.94V; s.s was 1205 mV/decade; $I_{on}/I_{off}$ was $6.96 \times 10^5$; $I_{d,sat}$ (@$V_g$=−20V) was $-4.62 \times 10^{-8}$ A; $I_{d,sat}/W$ (@$V_g$=−20V) was $-9.23 \times 10^{-11}$ A/μm; and the integration time was normal.

grown $SiO_2$ layer. The Th-Ox acts as a blocking layer to improve gate leakage. As shown in FIGS. 9a and b, as well as Table 2 below, The OTFT exhibited a carrier mobility of 0.35 cm² V⁻¹ s⁻¹, and an on/off ratio of $1 \times 10^5$. The mobility is increased by 7000% compared to the control sample. For the spin coated PQT-12, $I_g$ (@$V_g$=−5V) was $6.00 \times 10^{-10}$ A and the integration time was normal. The gate leakage in $I_dV_g$ was taken from $I_dV_d$ measurements. For the top contact, W/L were 500/150; μ was 0.35 cm²/Vs; $V_t$ was 0.50V; s.s was 633 mV/decade; $I_{on}/I_{off}$ was $1.74 \times 10^5$; $I_{d,sat}$ (@$V_g$=−20V) was $-1.46 \times 10^{-7}$ A; $I_{d,sat}/W$ (@$V_g$=−20V) was $-2.91 \times 10^{-10}$ A/μm; and the integration time was normal.

Figure 10:
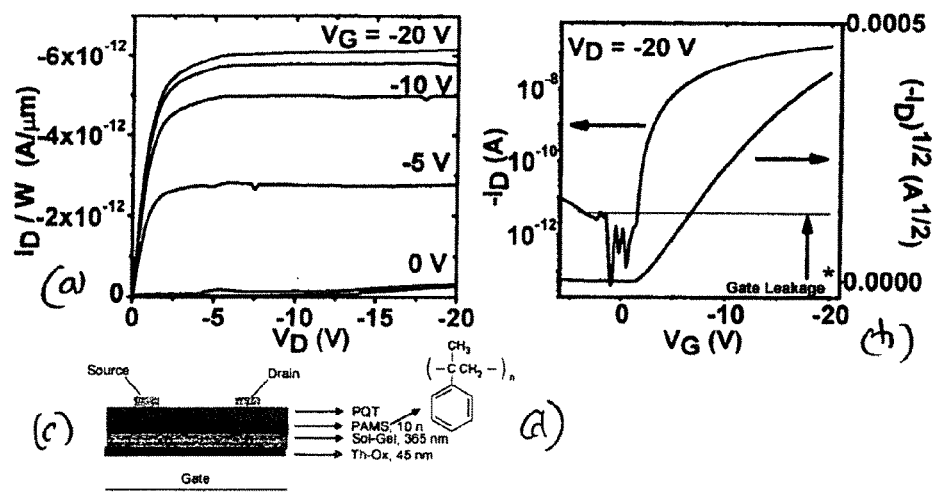
FIG. 10 is representations of a solution processed PQT with a sol-gel dielectric and a $SiO_2$ blocking layer, and its performance contrasted with a control sample.

In FIG. 10c there is shown an OTFT device fabricated using a 365 nm spin coated sol-gel film on a 45 nm thick thermally grown $SiO_2$ as blocking layer, a 10 nm thick poly-α-methylstyrene ("PAMS") (FIG. 10d) layer as a capping layer, and the PQT-12 layer. As shown in FIGS. 10b and c as well as Table 2 below, the OTFT exhibited a carrier mobility of 0.019 cm² V⁻¹ s⁻¹, and an on/off ratio of $1 \times 10^6$. The mobility is increased by 380% compared to the control sample. For the spin coated PQT-12, $I_g$ (@$V_g$=−5V) was $-3.79 \times 10^{-12}$ A and the integration time was normal. The gate leakage in $I_dV_g$ was taken from $I_dV_d$ measurements. For the top contact, W/L were 500/150; μ was 0.019 cm²/Vs; $V_t$ was −1.97V; s.s was 584 mV/decade; $I_{on}/I_{off}$ was $1.04 \times 10^6$; $I_{d,sat}$(@$V_g$=−20V) was $-3.08 \times 10^{-9}$ A; $I_{d,sat}/W$ (@$V_g$=−20V) was $-6.15 \times 10^{-12}$ A/μm; and the integration time was normal. Table 2 below is a summary of the parameters extracted from the OTFTs fabricated using Th-Ox (thermally grown $SiO_2$), Th-Ox+Dielectric (Sol-Gel), Th-Ox+Dielectric+PAMS (poly-α-methylstyrene).

TABLE 2

| Dielectric Thickness (nm) | μ (cm²/Vs) | $V_t$ (V) | s.s (mV/decade) | $I_{ON}/I_{OFF}$ | $I_{D,sat}$ (A) | $C_i$ (F/cm²) |
|---|---|---|---|---|---|---|
| 45 nm (th-ox) | 0.005 | −3.94 | 1205 | $6.96 \times 10^5$ | $-4.62 \times 10^{-8}$ | $7.13 \times 10^{-8}$ |
| 45 nm (th-ox) + 365 nm (Dielectric) | 0.35 | −0.50 | 633 | $1.74 \times 10^5$ | $-1.46 \times 10^{-7}$ | $1.66 \times 10^{-8}$ |
| 45 nm (th-ox) + ~365 nm (SG) + ~10 nm PAMS | 0.019 | −1.97 | 584 | $1.04 \times 10^6$ | $-3.08 \times 10^{-9}$ | $2.47 \times 10^{-8}$ |

Figure 11:
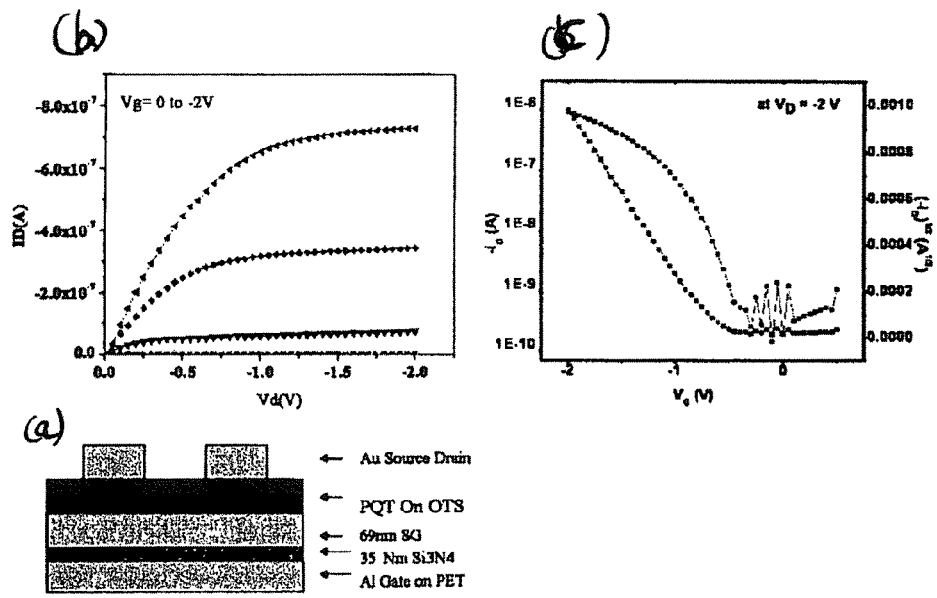
FIG. 11 is a representation of an exemplary embodiment with a nitride blocking layer on flexible substrates and its performance contrasted with a control sample.

In FIG. 11, there is shown an OTFT device fabricated using a 69 nm spin-coated sol-gel film on a 35 nm thick sputtered silicon nitride, a monolayer of octyltrichlorosilane (OTS) layer as capping layer, and the PQT-12 layer on aluminized polyester flexible substrate. As shown in FIG. 11 and Table 3 below, the OTFT exhibited a carrier mobility of 0.64 cm²/V s, and an on/off ratio of $5 \times 10^3$. Table 3 is a summary of the parameters extracted from the OTFTs fabricated using silicon nitride+sol-gel+OTS on aluminized polyester flexible substrate.

TABLE 3

| Dielectric | $\mu_h$ (cm²/Vs) | $V_t$ (V) | s.s (mV/decade) | $I_{ON}/I_{OFF}$ | $I_{D,SAT}$ (A) | $C_i$ (F/cm²) |
|---|---|---|---|---|---|---|
| Silicon Nitride (35 nm) + Sol-gel (69 nm) + OTS | 0.64 | −0.61 | 300 | $5 \times 10^3$ | $-9.52 \times 10^{-7}$ | $1.56 \times 10^{-7}$ |

As shown below, for the synthesis of sol-gel polymer composite films as a dielectric layer a titania precursor—titanium isopropoxide($Ti(OCH(CH_3)_2)_4$)—was loaded into the core of PS-P4VP in toluene solution. The organic salt of titanium has good solubility in the micellar solution and strong interaction between pyridine and $Ti(OCH(CH_3)_2)_4$ is expected. Coordination occurred between the Ti in the organic salt and the nitrogen in the pyridine ring.

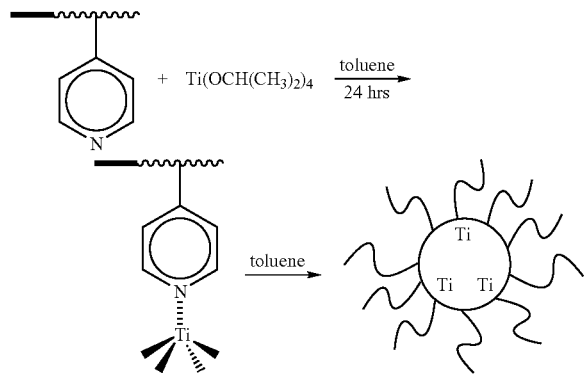

Dielectric films can be prepared by solution spin coating, casting, or printing at low temperature and under ambient conditions. OTFTs prepared by the methods disclosed have application in commercial products such as, for example, backplanes for organic light emitting diodes, RFID tags, organic sensors, gas sensors, bio sensors, and ASICs.

Whilst there has been described in the foregoing description exemplary embodiments of the present invention, it will be understood by those skilled in the technology concerned that many variations in details of design, construction and/or operation may be made without departing from the present invention.

The invention claimed is:

1. A sol-gel film for use in organic thin film transistors as a dielectric film, the sol-gel film comprising at least one of: a polymer, and a co-polymer; the at least one of the polymer and co-polymer containing clusters of nano-particles of at least one selected from the group consisting of: inorganic materials, metal, and metal-oxide, wherein the sol-gel further comprises a mixture of hydrophobic molecules for altering molecular arrangements of a semiconductor grown on the sol-gel film.

2. A sol-gel film according to claim 1, wherein the sol-gel film is at least one of:
comprises at least one member selected from the group consisting of: organosilicates, organosilanes, silane coupling agents, silicates derivatives, silanes derivatives, metal alkoxides, metal alkoxyalkoxide, tetraalkylorthosilicate; and a polymer consisting of at least one member of the group consisting of: poly(methyl methacrylate), poly(vinyl alcohol), polyethylene oxide-based block copolymers, and polystyrene-poly(4-vinyl pyridine) diblock copolymer;
comprises at least one of: undoped spin-on-glass, and doped spin-on-glass;
a mixture of one or more of: an organic polymer, an organic monomers, and organically modified sol-gels;
is doped by at least one of: a metal oxide, and a block copolymer composite with core comprising inorganic materials, metal, or metal-oxide; wherein the block copolymer comprises polystyrene-poly(4-vinyl pyridine) and contains metallorganic precursor, the metal precursors comprising titanium isopropoxide; and the metal oxide is at least one of: metal alkoxyalkoxide, and metal alkoxide;
has a dielectric constant in the range 2 to 50; and
has a dielectric constant in the range 2 to 50.

3. A sol-gel film as claimed in claim 1, wherein the hydrophobic molecules comprise at least one of: octadecyltrichlorosilane, hexamethyldisilazane, and derivatives thereof.

4. An organic thin film transistor comprising a sol-gel film according to claim 1, the sol-gel film being formed as layer before the semiconductor layer and/or on substrate.

5. An organic thin film transistor as claimed in claim 4, wherein the substrate is selected from the group consisting of: glass, plastic, quartz, metal foil, undoped silicon and heavily doped silicon.

6. An organic thin film transistor as claimed in claim 4 having at least one property selected from the group consisting of: a sub-threshold slope less than 2 volts per decade, and an on/off ratio of at least $10^3$.

7. An organic thin film transistor according to claim 4, wherein the sol-gel film is a surface modifier to enhance the transport properties in a semiconductor; and wherein the semiconductor is at least one of: organic, inorganic, hybrids, or mixtures thereof.

8. An organic thin film transistor as claimed in claim 7, wherein the semiconductor is pentacene.

9. An organic thin film transistor according to claim 4, further comprising at least one of: a layer of poly[5,5'-bis(3-dodecyl-2-thienyl)-2,2'-bithiophene]; and a capping layer of organic, inorganic, hybrids, or mixtures thereof between the sol-gel layer and the semiconductor layer, the capping layer being at least one of: poly-α-methylstyrene and octyltrichlorosilane.

10. An organic thin film transistor according to claim 4, wherein the organic thin film transistor comprises one of: a bottom gate with top contact, a bottom gate with bottom contact, top gate with top contact, a top gate with bottom contact, a top gate with top contact enhanced by surface modifier, and a top gate with bottom contact enhanced by surface modifier.

11. An organic thin film transistor comprising a sol-gel film according to claim 1, wherein the sol-gel film further comprises a semiconductor comprising at least one selected from the group consisting of: a semiconductor material, a plurality of semiconductor materials, and a mixture of semiconductor materials.

12. An organic thin film transistor according to claim 11, wherein the semiconductor is one of: deposited on the sol-gel film, and not deposited on the sol-gel film.

13. An organic thin film transistor according to claim 11, wherein the semiconductor is at least one of: organic, inorganic, hybrids, or mixtures thereof.

* * * * *